United States Patent [19]
Jones

[11] Patent Number: 5,023,068
[45] Date of Patent: Jun. 11, 1991

[54] DIAMOND GROWTH

[76] Inventor: Barbara L. Jones, 80 Chisbury Place, Forest Park, Bracknell, RG12 3TX, England

[21] Appl. No.: 343,910

[22] Filed: Apr. 26, 1989

[30] Foreign Application Priority Data

Apr. 28, 1988 [GB] United Kingdom ................. 8810111

[51] Int. Cl.$^5$ .............................................. C01B 31/06
[52] U.S. Cl. ............................ 423/446; 156/DIG. 68; 501/86; 427/39
[58] Field of Search ............... 423/446; 136/DIG. 68; 501/86; 427/39; 204/173

[56] References Cited

U.S. PATENT DOCUMENTS

| | | | |
|---|---|---|---|
| 3,030,187 | 4/1962 | Eversole | 423/446 |
| 3,961,103 | 6/1976 | Aisenberg | 423/446 |
| 4,434,188 | 2/1984 | Kamo et al. | 204/173 |
| 4,767,608 | 8/1988 | Matsumoto et al. | 156/DIG. 68 |
| 4,816,286 | 3/1989 | Hirose | 427/54.1 |
| 4,869,923 | 9/1989 | Yamazaki | 427/38 |

FOREIGN PATENT DOCUMENTS

| | | | |
|---|---|---|---|
| 0136408 | 4/1985 | European Pat. Off. | 423/446 |
| 59-63732 | 4/1984 | Japan | 423/446 |
| 60-54995 | 3/1985 | Japan | 423/446 |
| 62-167294 | 7/1987 | Japan | 423/446 |

OTHER PUBLICATIONS

JP-A-01 28 296 (Patent Abstracts of Japan, vol. 13, No. 211).
JP-A-61 158 898 (Patent Abstracts of Japan, vol. 10, No. 362).
Misuda, et al., Journal of Materials Science, vol. 22, No. 5, May 1987, pp. 1557-1562.
JP-A-62 167 294 (Patent Abstracts of Japan, vol. 12, No. 11, Kamo, Journal of Crystal Growth, vol. 62, 1983, pp. 642-644.
Abstract of Japanese Patent JP-139694.

Primary Examiner—Olik Chaudhuri
Assistant Examiner—Robert M. Kunemund
Attorney, Agent, or Firm—Scully, Scott, Murphy & Presser

[57] ABSTRACT

Crystalline diamond is grown on a substrate by placing the substrate on a nitride surface which completely covers a graphite support, creating an atmosphere of a gaseous carbon compound around the substrate, bringing the temperature of the nitride surface and the substrate to at least 600° C., and subjecting the gaseous carbon compound to microwave energy suitable to cause the compound to decompose and produce carbon which deposits on the substrate and forms crystalline diamond thereon.

16 Claims, 6 Drawing Sheets

DIAMOND GROWTH

BACKGROUND OF THE INVENTION

This invention relates to diamond growth.

Various methods have been proposed and tried for growing diamond on diamond seed crystals by chemical vapour deposition (CVD) using gaseous carbon compounds such as hydrocarbons or carbon monoxide. The gaseous compound can be produced from a liquid carbon compound such as an alcohol or acetone. The gaseous carbon compounds may be decomposed by various methods including the use of heat and radio frequency (RF) energy, and also by means of microwave energy. Much of the material which is grown by these prior art methods is diamond-like rather than crystalline diamond.

An article entitled "Diamond Synthesis from Gas Phase in Microwave Plasma" by M. Kamo et al, Journal of Crystal Growth 62 (1983) 642 to 644 describes preliminary results of a study involving crystalline diamond growth on a non-diamond substrate using a gaseous mixture of hydrogen and methane under microwave glow discharge conditions. The diamond growth took place on silicon wafers supported by an alumina basket.

SUMMARY OF THE INVENTION

According to the present invention, there is provided a method of growing crystalline diamond on a substrate including the steps of providing a surface of a suitable nitride, placing the substrate on the nitride surface, creating an atmosphere of a gaseous carbon compound around the substrate, bringing the temperature of the nitride surface and the substrate to at least 600° C., and subjecting the gaseous carbon compound to microwave energy suitable to cause the compound to decompose and produce carbon which deposits, on the substrate and forms crystalline diamond thereon.

DETAILED DESCRIPTION OF THE INVENTION

Figure 1:
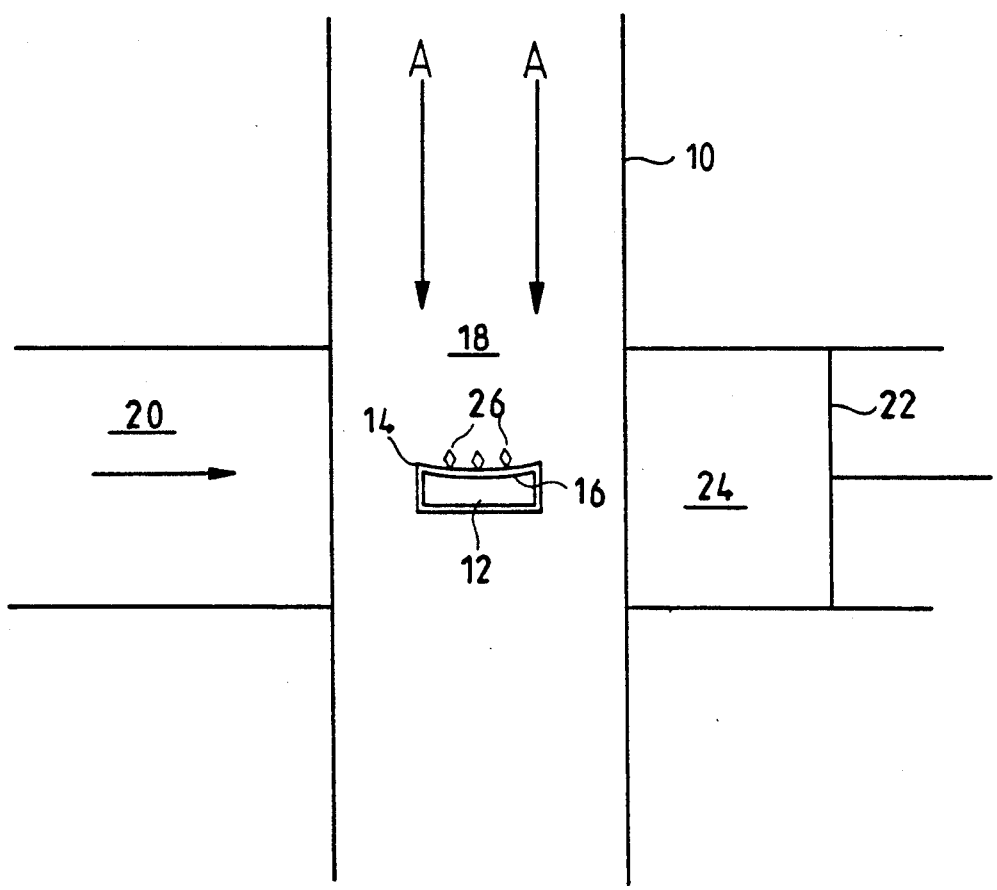
FIG. 1 illustrates schematically apparatus suitable for carrying out the method of the invention.

Essential to the invention is that the substrate is placed on a surface of a suitable nitride. This nitride, during the method, releases nitrogen atoms in small amounts which create a suitable nitrogen concentration in the atmosphere surrounding the substrate slowing the diamond growth and hence improving it. This surface will generally and preferably cover completely a support which is preferably a microwave energy sink, i.e. a support which will absorb microwave energy and thereby be heated. An example of such a support is a graphite support which will absorb at least 50% of the microwave energy.

The nitride may be silicon nitride, aluminium nitride, titanium nitride, tantalum nitride or the like. The nitride surface will typically be formed on a support by means of known chemical vapour deposition methods. Such methods will result in the nitride containing substantial quantities of hydrogen, e.g. 1 to 30 atomic percent. This hydrogen will be strongly bonded. In the case of silicon nitride produced by this method the nitride will typically have the formula:

$SiN_x.H$ where $x = 0.6$ to $1.4$.

The temperature of the nitride surface and the substrate are preferably maintained at a temperature of 600° to 1000° C. during the time the decomposition of the carbon compound and deposition of carbon on the substrate take place. The substrate will generally be at a higher temperature than the nitride surface. The microwave energy which is used to decompose the carbon compound will typically be the source of the heating energy for the surface.

The frequency of the microwave energy may vary over a wide range. Typically the frequency will be in the range 200 MHz to 90 GHz. An example of a typical frequency which may be used is 2.45 GHz. The microwave energy will typically be maintained for a period of at least several hours, e.g. 2 to 10 hours.

The gaseous carbon compound will preferably be introduced into a confined space containing the substrate. The compound may take the form of a mixture with a reducing gas such as hydrogen. Typically, the mixture will contain less than 5% by volume of the carbon compound. The carbon compound will generally be a suitable hydrocarbon such as methane. Examples of other suitable carbon compounds are ethane, propane, fluorinated hydrocarbons such as $CF_4$, $C_2F_6$ and $CHF_3$, carbon monoxide and carbon dioxide.

The substrate may be crystalline, glassy or amorphous. Examples of suitable substrates are glass, metal, ceramics and diamond. If the substrate is diamond or a cubic crystalline material of a suitable lattice constant match to diamond, epitaxial diamond growth will occur thereon. Good crystalline diamond layers and crystals have been grown on silicon substrates using the method of the invention.

In one form of the invention, the substrate is diamond and the invention allows for the production of crystalline diamond layers of good quality to be grown thereon. The diamond substrate may be natural or synthetic. For example, the substrate may be a diamond of type Ia and it is possible to grow diamond of type IIa thereon. Diamond of type Ia contains aggregated nitrogen and constitutes 98% of all natural diamond, while diamond of type IIa is nitrogen free and has the best thermal conductivity of any known material. Thus, a diamond body of type Ia having diamond of type IIa joined thereto can be used as a heat sink. A diamond body comprising a layer of diamond of type IIa joined to a diamond substrate is believed to be new and forms another aspect of the invention. Since the growth of the diamond of type IIa will be epitaxial, the diamond layer and the substrate will be joined by an integrally formed diamond interface.

It is possible by the method of the invention not only to grow diamond films but also large diamond crystals. Indeed, it is possible to produce excellent cubo-octahedral diamond crystals and thick epitaxial crystalline diamond films. Because of the high quality crystalline diamond which is grown, it is possible to use the method of the invention to grow diamond in cracks in naturally occurring gem-stone quality diamonds to improve their quality.

Embodiments of the invention will now be described with reference to the accompanying drawings. FIG. 1 illustrates schematically apparatus suitable for carrying out the method of the invention. The apparatus consists of a quartz tube 10 in which is suspended one or more graphite boats 12. One graphite boat is illustrated and it has a layer 14 of silicon nitride covering its entire surface 16. The graphite boat is thus completely enclosed by the nitride layer. Microwave energy from a suitable source passes into the space 18 within the tube through the passage 20. A quarter wavelength shorting plate 22 for the microwaves is provided in passage 24. A source of gaseous carbon compound is fed into the space 18 in the direction of the arrow A.

This apparatus was used to produce crystalline diamond growth on various diamond or cubic boron nitride (CBN) seed crystals 26 which were located on the silicon nitride layer 14. The wavelength of the microwaves was 2.45 GHz, the temperature of the graphite boat was maintained at a temperature of about 730° C. and that of the seed crystals was maintained at 830° C. The gaseous carbon compound consisted of methane gas which constituted about 5% by volume of a mixture with hydrogen gas.

Figure 2:
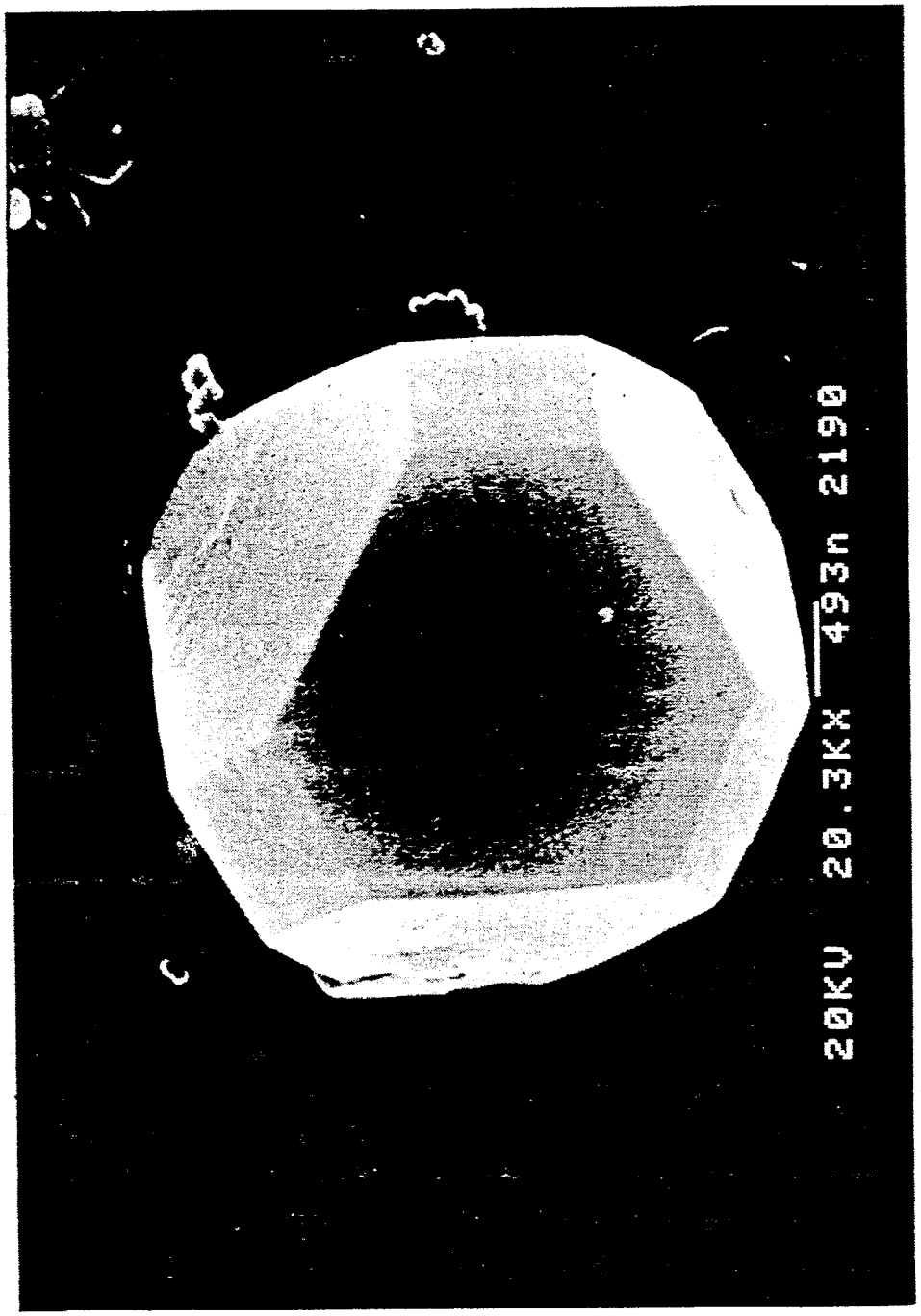
FIGS. 2 to 6 are photographs of typical diamonds and diamond films produced by the method of the invention.
Figure 3:
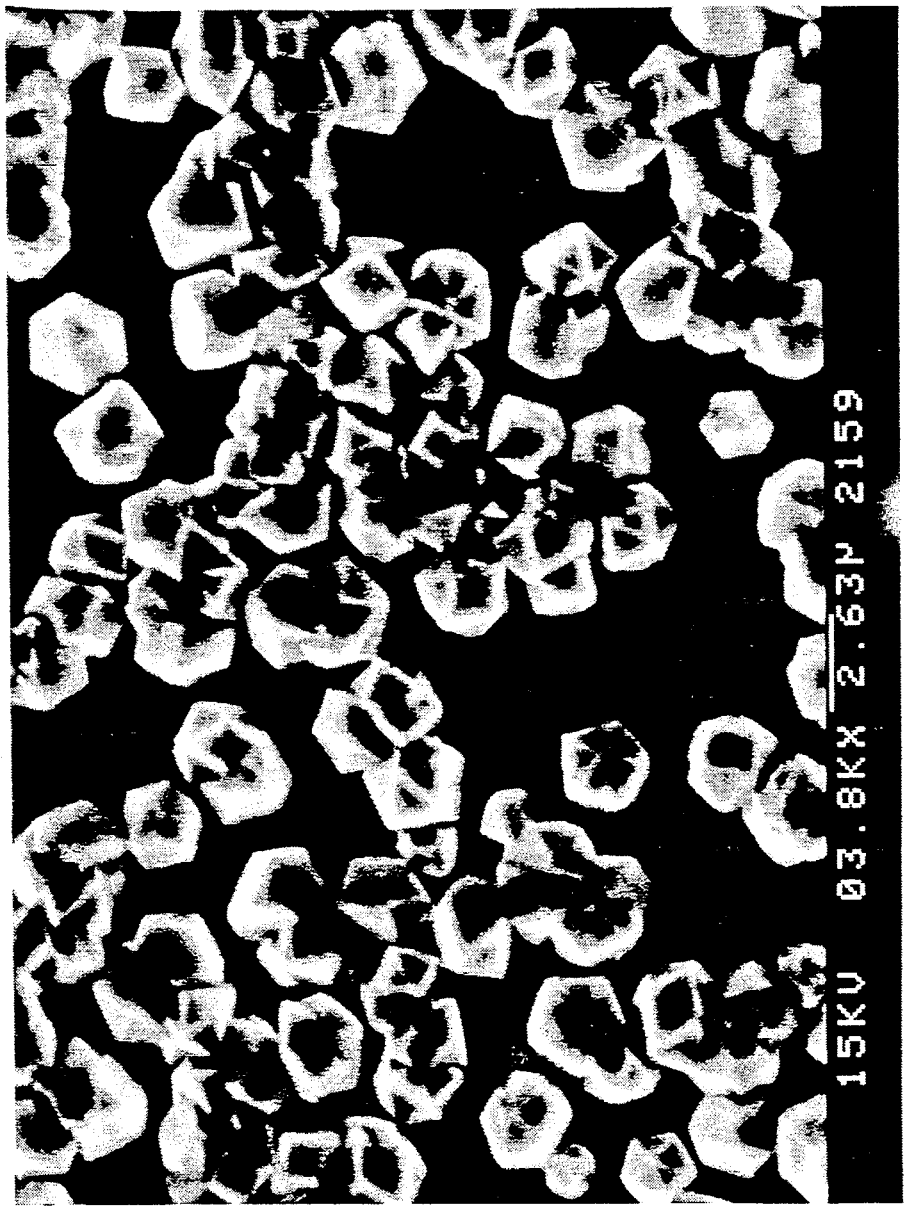
Figure 4:
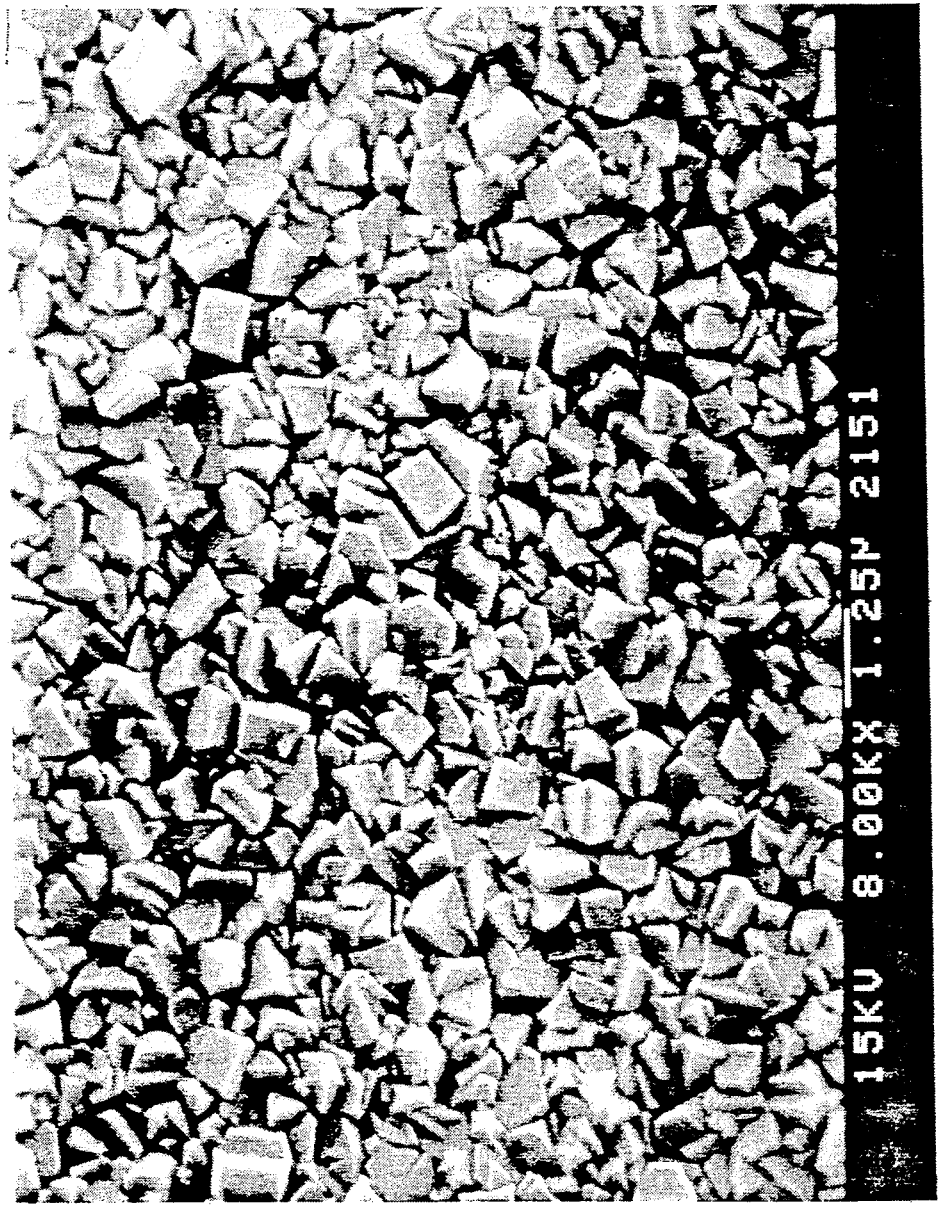
Figure 5:
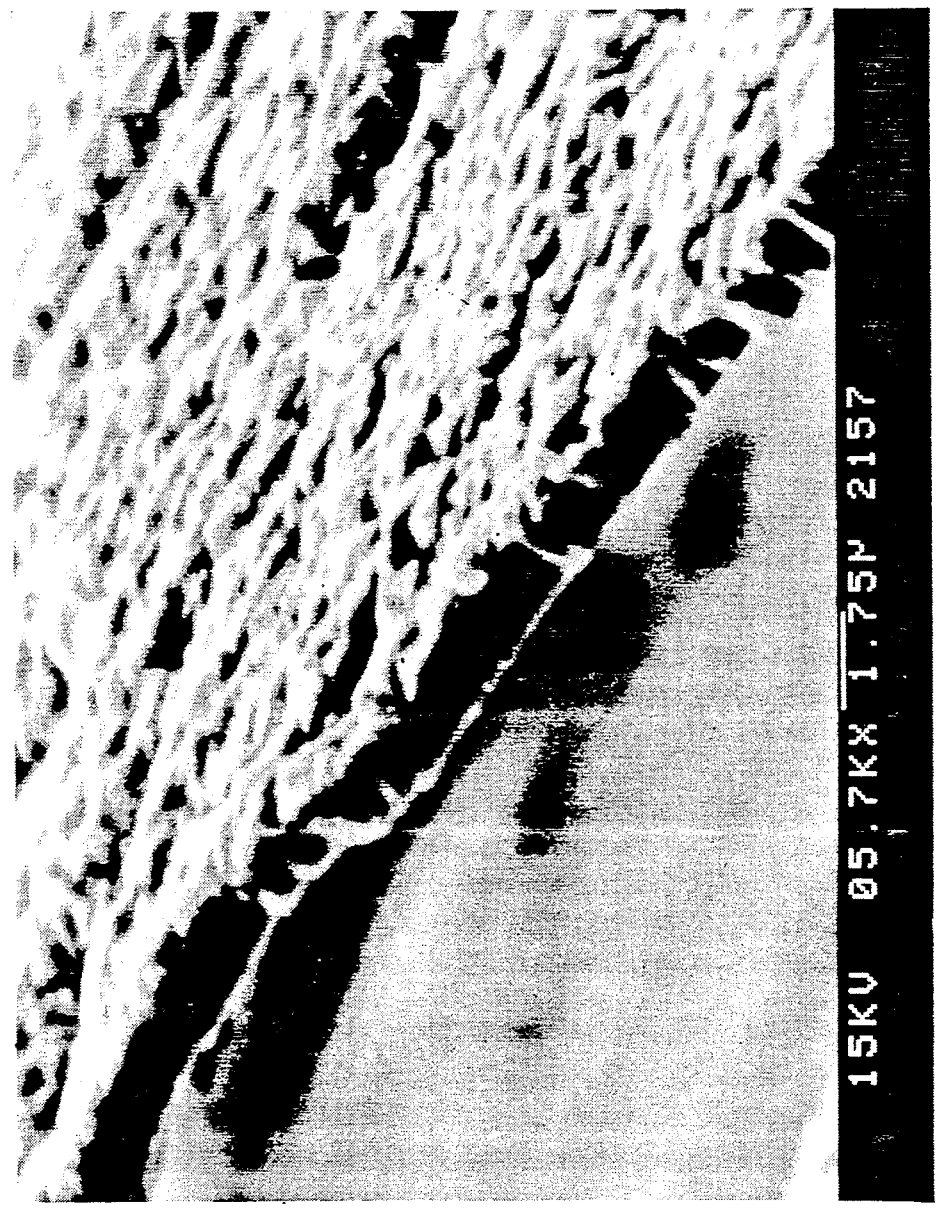
Figure 6:
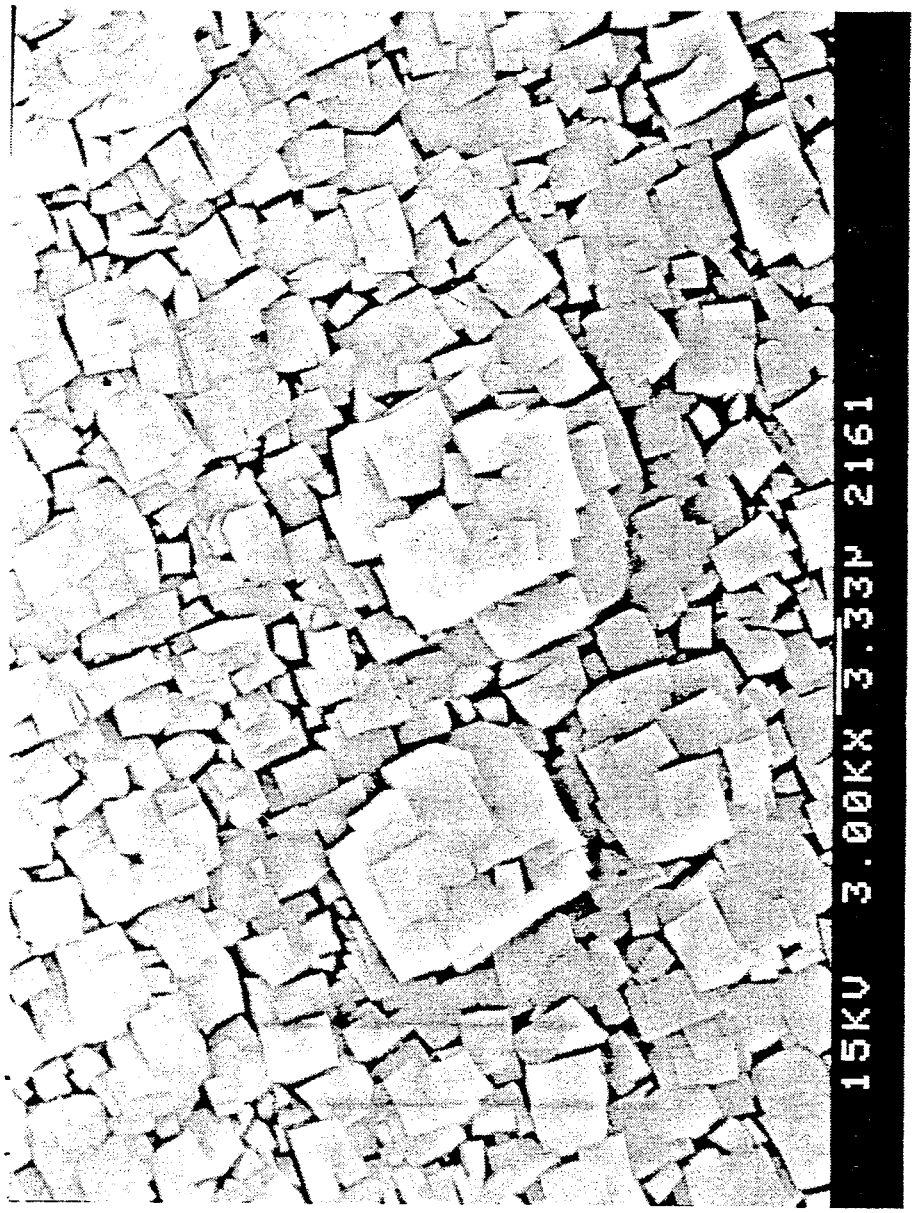

FIGS. 2 to 6 illustrate examples of diamonds and diamond films produced by the method of the invention. FIG. 2 is a photograph of a diamond crystal about 2 to 3 microns in size which was grown on a silicon substrate without the use of any diamond seed. FIG. 3 is a photograph of twinned diamond particles grown on a silicon substrate with CBN seeds. FIGS. 4 and 5 are different photographs of the same continuous diamond film exhibiting (100) and (111) facets. FIG. 6 is a photograph of a diamond film grown on a silicon substrate exhibiting only (100) facets.

I claim:

1. A method of growing crystalline diamond on a substrate which includes the steps of providing a surface of a nitride wherein the nitride is silicon nitride, aluminum nitride, titanium nitride or tantalum nitride, said nitride completely covering a support which is a microwave energy sink, placing the substrate on the nitride surface, creating an atmosphere of a gaseous carbon compound around the substrate, bringing the temperature of the nitride surface and substrate to at least 600° C., and subjecting the gaseous carbon compound to microwave energy suitable to cause the compound to decompose and produce carbon which deposits on the substrate and forms crystalline diamond thereon.

2. A method according to claim 1 wherein the nitride is silicon nitride.

3. A method according to claim 1 wherein the support is a graphite support.

4. A method according to claim 1 wherein nitride surface and the substrate are maintained at a temperature of 600° to 1000° C. during the time when the decomposition of the carbon compound and deposition of carbon on the substrate take place.

5. A method according to claim 1 wherein the substrate is maintained at a higher temperature than the nitride surface.

6. A method according to claim 1 wherein the frequency of the microwave energy is in the range 200 MHz to 90 GHz.

7. A method according to claim 1 wherein the microwave energy is maintained for a period of 2 to 10 hours.

8. A method according to claim 1 wherein the carbon compound is a hydrocarbon.

9. A method according to claim 8 wherein the hydrocarbon is methane.

10. A method according to claim 1 wherein the carbon compound forms part of a mixture of it with a reducing gas.

11. A method according to claim 10 wherein the reducing gas is hydrogen.

12. A method according to claim 1 wherein the substrate is crystalline.

13. A method according to claim 12 wherein the crystalline substrate is diamond.

14. A method according to claim 13 wherein crystalline diamond formed on the substrate is of type IIa.

15. A method according to claim 1 wherein the substrate is amorphous, glass or metal.

16. A method of growing crystalline diamond on a substrate which includes the steps of providing a support which is a microwave energy sink, the support being completely covered by a nitride layer, wherein said nitride layer is silicon nitride, aluminum nitride, titanium nitride or tantalum nitride creating an atmosphere of a gaseous carbon compound around the substrate, bringing the temperature of the nitride layer and the substrate to a temperature in the range 600° C. to 1000° C., the temperature of the substrate being higher than that of the nitride layer, subjecting the gaseous carbon compound to microwave energy of a frequency in the range 200 MHz to 90 GHz and maintaining this energy for a period of at least several hours thereby causing the compound to decompose and produce carbon which deposits on the substrate and forms crystalline diamond thereon.

* * * * *